United States Patent
Kisakuerek

(10) Patent No.: US 9,226,424 B2
(45) Date of Patent: Dec. 29, 2015

(54) ELECTRONIC ASSEMBLY AND OPERATING METHOD

(75) Inventor: Hakan Kisakuerek, Munich (DE)

(73) Assignee: DIEHL BGT DEFENCE GMBH & CO. KG, Ueberlingen (DE)

( * ) Notice: Subject to any disclaimer, the term of this patent is extended or adjusted under 35 U.S.C. 154(b) by 76 days.

(21) Appl. No.: 13/491,807

(22) Filed: Jun. 8, 2012

(65) Prior Publication Data

US 2012/0243623 A1 Sep. 27, 2012

Related U.S. Application Data

(63) Continuation of application No. PCT/EP2010/007117, filed on Nov. 24, 2010.

(30) Foreign Application Priority Data

Dec. 8, 2009 (DE) .......................... 10 2009 057 273

(51) Int. Cl.
*G06F 13/00* (2006.01)
*H05K 7/14* (2006.01)

(52) U.S. Cl.
CPC ............ *H05K 7/1477* (2013.01); *H05K 7/1484* (2013.01)

(58) Field of Classification Search
CPC ........................... G06F 13/4022; H04L 49/40
USPC ........... 710/100, 305–306, 316–317; 361/679
See application file for complete search history.

(56) References Cited

U.S. PATENT DOCUMENTS

| | | | |
|---|---|---|---|
| 5,428,535 A | 6/1995 | Katsumata et al. | |
| 5,710,708 A | 1/1998 | Wiegand | |
| 6,542,952 B1 * | 4/2003 | Western | 710/305 |
| 6,778,389 B1 | 8/2004 | Glovatsky et al. | |
| 7,123,486 B1 * | 10/2006 | Koens et al. | 361/788 |
| 2002/0124114 A1 * | 9/2002 | Bottom et al. | 709/251 |
| 2007/0080203 A1 * | 4/2007 | Iwata et al. | 235/375 |
| 2008/0137284 A1 * | 6/2008 | Flynn et al. | 361/685 |
| 2008/0285580 A1 * | 11/2008 | Yotsumoto | 370/412 |
| 2009/0043937 A1 | 2/2009 | Lee et al. | |
| 2010/0005328 A1 * | 1/2010 | Rakshani et al. | 713/322 |
| 2010/0281309 A1 * | 11/2010 | Laurenti et al. | 714/45 |

FOREIGN PATENT DOCUMENTS

| | | |
|---|---|---|
| DE | 195 39 354 A1 | 5/1996 |
| DE | 102 44 365 A1 | 4/2004 |
| EP | 1 120 695 A2 | 8/2001 |
| KR | 20030094464 A | 12/2003 |
| WO | 00/55742 A2 | 9/2000 |

OTHER PUBLICATIONS

International Search Report of PCT/EP2010/007117.

* cited by examiner

*Primary Examiner* — Glenn A Auve
*Assistant Examiner* — Kim T. Huynh
(74) *Attorney, Agent, or Firm* — Laurence Greenberg; Werner Stemer; Ralph Locher

(57) ABSTRACT

An electronic assembly has a plurality of functional units each including a board element populated with electronic modules. The board elements are connected to one another in terms of signaling via a contact board. An assembly having a high degree of communication flexibility in conjunction with favorable production costs can be provided if it contains a communication unit connected to the contact board directly by data lines. The communication unit is populated with electronic components in such a way that it serves as a communication interface for modules of the board elements.

12 Claims, 4 Drawing Sheets

ELECTRONIC ASSEMBLY AND OPERATING METHOD

CROSS-REFERENCE TO RELATED APPLICATION

This application is a continuation, under 35 U.S.C. §120, of copending international application PCT/EP2010/007117, filed Nov. 24, 2010, which designated the United States; this application also claims the priority, under 35 U.S.C. §119, of German patent application DE 10 2009 057 273.2, filed Dec. 8, 2009; the prior applications are herewith incorporated by reference in their entirety.

BACKGROUND OF THE INVENTION

Field of the Invention

The invention relates to an electronic assembly having a plurality of functional units each comprising a board element populated with electronic modules. The board elements are connected to one another in terms of signaling via a contact board.

Electronic assemblies for controlling complex processes usually comprise a plurality of functional units each respectively on a circuit board, which are allocated different functions or tasks. In this case, the complex control task is achieved by an interaction of the functional units processing the different partial tasks.

The mechanical and signaling connection of the individual functional units is usually realized by way of a so-called backplane, which is also referred to as a bus circuit board. Such a backplane comprises a slot for each functional unit, by means of which slots the functional units is fixedly connected to the backplane mechanically and in terms of signaling. The individual slots are wired to one another according to the task of the electronic assembly and the individual partial tasks of the functional units, such that the functional units can communicate with one another and achieve their partial tasks by data exchange among one another. The electrical connections produced by the backplane between the slots can vary greatly and determine the architecture of the backplane and of the electronic assembly.

By virtue of the task-specific wiring, backplanes form a central constituent of integrated, computer-controlled systems, primarily appertaining to telecommunications, metrology and automation, medical technology or aeronautics and rail road technology. As the central element, the backplane forms a bus architecture for the connection of the individual pins of the slots and thus of the individual contact locations of all the functional units.

SUMMARY OF THE INVENTION

It is accordingly an object of the invention to provide an electronic assembly, which overcomes the above-mentioned disadvantages of the heretofore-known devices and methods of this general type and which provides for an electronic assembly which exhibits a high degree of communication flexibility in conjunction with favorable production costs.

With the foregoing and other objects in view there is provided, in accordance with the invention, an electronic assembly, comprising:

a plurality of functional units each including a board element populated with electronic modules;

a contact board connecting said board elements to one another in terms of signaling;

a communication unit directly connected to said contact board by data lines, said communication unit being populated with electronic components configuring said communication unit to serve as a communication interface for said electronic modules of said board elements.

In other words, the objects of the invention are achieved by way of an electronic assembly of the type mentioned in the introduction which, according to the invention, comprises a communication unit connected to the contact board directly by data lines, said communication unit being populated with electronic components in such a way that it serves as a communication interface for modules of the board elements.

In this case, the invention is based on the consideration that from among the functional units at least individual functional units communicate with systems outside the electronic assembly in order to bring about a control or to be able to receive sensor or control signals. For this purpose, the individual functional units are prepared in accordance with their tasks for communication toward the outside, such that they are provided with corresponding settings with regard to a required data transmission rate, data form and/or a transmission protocol. If a plurality of similar assemblies are produced for managing similar tasks in similar control processes, then it is advantageous if the different assemblies can be embodied identically at least with regard to their functional units, in order to simplify manufacture. This simplification is impeded by the necessary communication adaptation of the individual functional units to external control units, actuators or sensors. Since such a communication adaptation is generally necessary for a plurality of functional units of an electronic assembly, it is particularly expedient to centralize it. An appropriate central functional unit in this case is a backplane, which constitutes a central functional unit of the assembly.

The invention is based on the further consideration that a further standardization of similar assemblies can be achieved by an even further-reaching modular construction that allocates different functions to different structural units. A functional separation of communication adaptation and task-specific wiring of the backplane is advantageous in this regard. This separation can be accomplished if the task-specific wiring of the functional units is performed by a first part of the backplane and the communication adaptation is performed by a second part of the backplane. In this case, it is not necessary for both parts to perform the further customary tasks of a backplane, such as the mechanical connection of the functional units. This modular separation can be accomplished by the separation of the backplane into a contact board and a communication unit. The communication unit and the contact board can be produced separately from one another and therefore also configured separately from one another.

The electronic assembly can be a control unit for the autonomous control of a system, for example for the control of a missile. The board elements can be circuit boards which are also mechanically connected to one another via the contact board. A module can be a processor or comprise one or a plurality of electronic components. The communication unit expediently forms a dedicated board element mounted separately from the contact board in the electronic assembly. In this case, it is advantageous if the communication unit is mounted mechanically separately from the contact board in a housing, for example.

The communication unit is advantageously embodied such that it forms an information-linking communication interface between at least one internal communication mode of a functional unit with an external communication mode—different therefrom—of a unit outside the electronic assembly. A communication interface is considered to be a unit which is provided for adapting two different communication modes to one another. The difference can reside in different communication protocols, data transfer protocols, communication data rates, signal amplitudes and the like. The external unit can be an external control unit, sensors, actuators or the like. In addition, the communication unit can be a communication interface between an internal communication mode of a functional unit and a different communication mode of a further functional unit of the electronic assembly.

It is additionally advantageous if a data connection produced by the data lines between the functional units and the communication unit form at least one high-speed bus. If appropriate, it may be sufficient if only the internal connection between the functional units, and thus data lines in the contact board, is embodied as a high-speed bus. A high-speed bus can be understood hereinafter to be a bus connection having a data rate of at least 1 Mbit/s.

The modularity principle can be further fostered if the contact board is passive and the communication unit is active. In this context, activity is understood to mean the population with active components, such as ICs, or passive components, such as resistors or capacitors. Accordingly, the contact board is passive if it carries no active or passive components, but rather is only provided with data lines, for example, in which the data or signals are passed in particular without any data processing from an input contact to an output contact.

Through the centralization of the communication adaptation of the functional units among one another and of the functional units toward the outside, that is to say to units outside the electronic assembly, the functional units can be standardized. They are therefore expediently all embodied identically in terms of their hardware. By means of different data processing programs such as, for example, firmware and/or further freely programmable software, the functional units can be oriented toward their different tasks.

The modular construction of the backplane enables the electronic assembly to be adapted particularly simply to different tasks, for example by only one structural unit, such as the communication unit and/or the contact board, being adapted and the task. In a system comprising, for example, a first electronic assembly for a first task and a second electronic assembly for a different second task, therefore, the functional units of the first assembly can be identical in terms of their hardware to the functional units of the second assembly. It may be sufficient if only the two communication units differ in terms of their hardware and are respectively adapted to the corresponding task, if appropriate even with identical contact boards. In the case of largely different tasks of the two assemblies, it is also possible for the contact boards to be different, for example in such a way that the functional units of the two assemblies are wired differently by the two contact boards.

In accordance with an advantageous feature of the invention, the contact board has a task-specific line routing which is adapted to individual tasks of the functional units and which is embodied differently from one to a second functional unit than from the second to a third functional unit. In particular, the line routings between all of the functional units can be different in each case.

In a further advantageous embodiment of the invention, one of the electronic components of the communication unit is a router. It is thereby possible to centralize the communication between functional units of the electronic assembly and/or a functional unit and an external unit. Consequently, a specific communication wiring adapted to communication tasks is no longer necessary, under certain circumstances, but rather can be replaced by a corresponding programming of the router. It is thereby possible to simplify the production of the electronic assembly and to increase the flexibility of the communication. The router is advantageously embodied as a non-blocking router, that is to say that it has an available data processing rate which is higher than the maximum possible data traffic which it has to manage. For each port of each functional unit it is thereby possible to make available to it at any time the full data transmission rate for it.

In addition, it is proposed that the router be embodied for logging communication between electronic modules of the board elements. A debugging of the electronic assembly can thereby be carried out in a manner by data interrogation by the router.

A further advantageous configuration of the invention provides for the communication unit to have a power supply for the functional units. By this means, too, an advantageous modular and in particular compact design of the electronic assembly can be implemented. Advantageously, the power supply is embodied in such a way that it produces an intermediate voltage lying between a voltage fed in externally and a voltage required by modules of the functional units. Thus, by way of example, an internal supply voltage of 3.3 volts can be transmitted in a manner insusceptible to faults over the transmission distances of the electronic assembly, wherein a voltage of 5 volts, 12 volts or higher from an external power supply system can be employed.

Further advantages of the standardized modular design can be obtained if the communication unit is prepared for controlling a switch-on sequencing of the individual functional units. It is thereby possible to dispense with initiation of the switch-on sequencing by the functional units themselves, which can thereby be simplified in terms of hardware and software and can thus be produced more easily in a standardizable fashion.

If the communication unit is provided with a test interface for functionally testing the individual functional units, then a debugging can be carried out in a simple manner from outside, in particular during the operation of the electronic functional unit, without each functional unit requiring such an interface separately. By means of the functional testing, each functional unit can expediently be tested individually.

With the above and other objects in view there is also provided, in accordance with the invention, a method for operating an electronic assembly as described above. It is proposed that, according to the invention, one of the electronic components be a router. It is thereby possible to carry out fault detection at a central location. The router logs, in particular, a communication of at least one functional unit. A functional checking of the functional units and/or of the modules is expediently carried out during the regular operation of the assembly.

The functional checking and, in particular, the rectification of a fault by means of a corresponding programming of the router can be triggered externally, that is to say from outside the electronic assembly, for example by a control unit with a corresponding checking function. For the purpose of functional checking, communication data can be compared with desired data for communication by the router.

A functional checking can be simplified if communication data are visualized for the display of communication processes. The visualization expediently takes place on a screen, in particular on the basis of a graphical representation. The functional checking can be triggered by an external enquiry and/or on the initiative of the router, for example if a routine log data comparison suggests a communication fault. The functional inner workings of the assembly can be checked and in particular visualized by the interrogation of the router.

Other features which are considered as characteristic for the invention are set forth in the appended claims.

Although the invention is illustrated and described herein as embodied in a electronic Assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
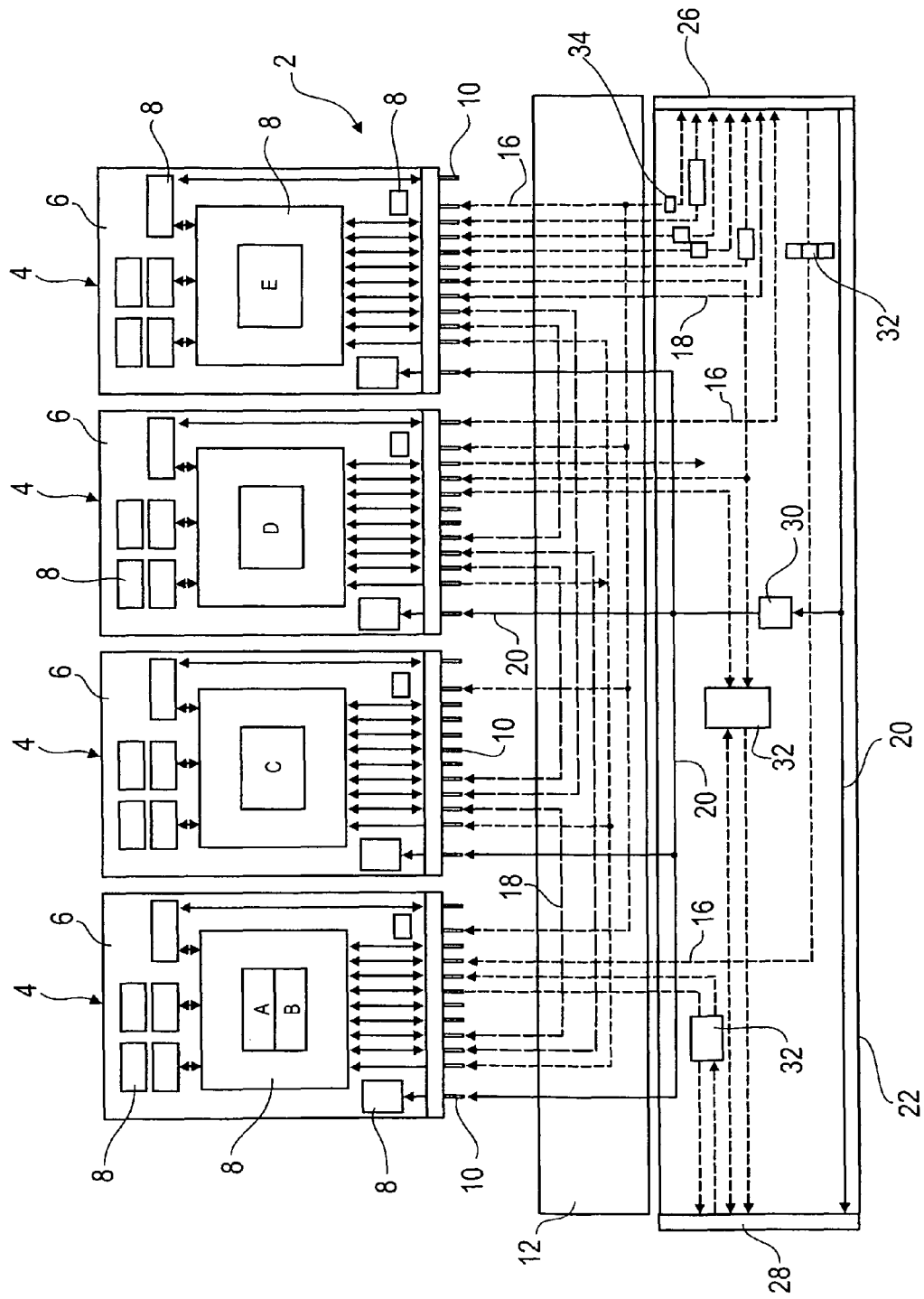
FIG. 1 shows a circuit diagram of an electronic assembly formed of a plurality of functional units, a contact board and a communication unit.

Referring now to the figures of the drawing in detail and first, particularly, to FIG. 1 thereof, there is seen a schematic circuit diagram of an electronic assembly 2 comprising four functional groups 4, each comprising a board element 6 in the form of a circuit board and electronic modules 8 arranged on the board. The electronic assembly 2, in this example, serves for controlling a guided missile and for evaluating signals of a homing head. A module 8 can be understood to be one or a plurality of electronic components which individually or jointly fulfill a function. In each of the functional groups 4, one of the modules 8 is a central processor equipped with software, that is to say one or a plurality of electronic data processing programs, for example in the form of firmware and additional freely programmable software. Each processor is thereby able to process a range of tasks or a function, wherein the functions of the processors are different and are indicated symbolically by the letters A to E in FIG. 1. Apart from the different programming, the functional groups 4 are embodied completely identically with regard to their hardware, that is to say their electronic modules 8 and the wiring thereof, that is to say the line routing among one another and toward the outside, and they are also identical otherwise.

Each of the board elements 6 carries a plurality of contact locations 10 in the form of pins by which the functional groups 4 are connected to a contact board 12 in terms of signaling and for power supply purposes and also mechanically. For this purpose, the contact locations 10 are inserted into corresponding contact receptacles 14 (see FIG. 3) of the contact board 12 in the form of metalized holes and are soldered, thus giving rise to a fixed mechanical and electrical connection between the board element 6 and the contact board 12. The contact board 12 in turn is connected to a communication unit 22 via a plurality of data lines 16, 18 and power supply lines 20, wherein the data lines 16, 18 and power supply lines 20 are incorporated into a film 24 (see FIG. 3) in the form of a ribbon cable.

The data lines 16, 18 and further data lines 16, 18 are laid in the contact board 12 such that a functionally related communication of the functional groups 4 among one another is made possible. Thus, data lines 18 embodied as high-speed buses, which are indicated by long dashes in FIG. 1, are arranged between the functional groups 4 in such a way that each of the functional groups 4 is connected directly or via a further functional group 4 to all the functional groups 4 via such a data line. A further such data line 18 is led via the communication unit 22 toward the outside, that is to say to outside the electronic assembly 2, and for this purpose leads into an interface 26, for example in the form of a plug, for connection to an external device, e.g. a control unit or a unit comprising actuators for actuating mechanical objects. Via further data lines 16, which are indicated by shorter dashes in FIG. 1, the functional groups 4 communicate via the interface 26 and a further interface 28 with the outside world, e.g. further functional groups, sensors or the like, which, for this purpose, are connected to the interfaces 26, 28 in terms of signaling.

Via a power supply line 20, the communication unit 22 can be supplied externally by a voltage for power supply purposes, in particular 5V, 12V or 28V, the latter being fed to a power supply unit 30. In the latter, the voltage is stepped down to a lower voltage, for example 3.3V, and passed on to the functional groups 4 via the further power supply lines 20. Each of the functional groups likewise has a power supply unit, indicated as module 8 in FIG. 1, for further transformation into one or a plurality of operating voltages of the modules 8 of the functional groups 4, for example 1.0V, 1.8V and 2.5V.

In terms of their functions, the contact board 12 and the communication unit 22 perform the tasks of a so-called backplane that connects a plurality of functional units to one another. In the exemplary embodiment illustrated in FIG. 1, said backplane, which is usually unified per se, is subdivided into two units, namely the passive contact board 12, which therefore carries no electronic modules whatsoever, and the active communication unit 22, which serves as a communication interface for the functional groups 4 or the modules 8 thereof toward the outside. For this purpose, the communication unit 22 carries components 32 prepared for adapting the communication of the modules 8 of the functional groups 4 to a communication to be carried out toward the outside. Thus, the components 32 adapt, for example, a communication protocol and/or an amplitude of communication signals from an internal communication to an external communication, and vice versa, such that a communication adaptation of the individual functional groups 4 can be obviated. Independently of their tasks indicated by the letters A to E, therefore, the latter can be embodied identically since the communication properties associated with the tasks are implemented toward the outside by corresponding components 32 of the communication unit 22.

On the basis of the exemplary embodiment illustrated in FIG. 1 it can be illustrated how a plurality of electronic assemblies embodied analogously to the assembly 2 can be produced efficiently for different tasks. Thus, alongside the electronic assembly 2 illustrated in FIG. 1, a further assembly 2 can be conceived, which is prepared for a different control task, for example of a different missile or of a different automation device. Both electronic assemblies 2 in each case comprise a number of functional groups 4, wherein the numbers need not be identical. The functional groups 4 are respectively inserted into a contact board 12 or soldered therein and connected to the communication unit 22 in the manner corresponding to the illustration in FIG. 1.

The central processors of the functional groups 4 are programmed according to the tasks. Otherwise, all functional groups 4 of both assemblies 2 can be embodied identically. In the case of similar tasks, the two contact boards 12 of the two assemblies 2 can also be embodied identically, only the communication unit 22 being adapted to the corresponding control units, sensors or the like. For this purpose, the two communication units 22 can carry different components 32 and be wired differently, that is to say have e.g. different line outputs at the interfaces 26, 28. In the case of very different tasks of the two assemblies 2, the contact boards 12 can also be correspondingly adapted to the tasks, such that the wiring, that is to say the line routings of the lines 16, 18 and, if appropriate, also of the power supply lines 20, is different and optimized to the tasks. By virtue of this modular construction, the same functional groups 4 and, if appropriate, even the same contact boards 12 can always be used for both assemblies 2. Adaptations of the electronic assemblies 2 to different tasks can therefore be achieved by simple changes in manufacture of the communication unit 22 and, if appropriate, of the contact board 12. A configuration of the functional groups 4 and an adaptation of the backplane to this configuration are no longer necessary.

A further task that can be assigned to the communication unit 22 is a switch-on sequencing of the individual functional groups 4. In order not to overload a voltage source, it is advantageous if, upon an initialization of the assembly 2, the individual functional groups 4 do not start at the same time, since, in such a case, many modules 8 have a high power consumption, which places high demands on the power supply. If it was previously customary for a first functional group 4 to switch on first, then to pass a switch-on signal to a next functional group 4, which in turn triggers the switch-on of a further functional group 4, such a switch-on sequencing can now be carried out by a component 32 of the communication unit 22. By this means, too, a specific adaptation of the functional groups 4 to a desired switch-on sequencing is obviated, since they are completely freed of the task of the switch-on sequencing. Corresponding signals can be passed from a component 32 via a data line 16 to the functional groups 4, which switch on at the command of the communication unit 22. The standardizability of the functional groups 4 can be increased further by means of this distribution of tasks adapted to the modularity of the assembly 2.

Identification of faults and rectification of faults are accorded high importance in electronic assemblies 2. For the simple and centralized management of this task, the communication unit 22 carries a component 34 configured as a test interface. By means of this test interface, each of the functional groups 4 can be accessed with test signals and corresponding output signals for checking the function of the functional groups 4 can be tapped off at the interface 26. A corresponding preparation at the individual functional groups 4 can be obviated, such that the latter—independently of their functions impressed by programming—can be tested in respect of the correct processing of their tasks. Particular requirements made of the hardware or wirings by such tests can be implemented in the communication unit 22. An adaptation which is necessary with regard to the different tasks of the functional groups 4 therefore again only concerns the communication unit 22, such that a high standardization of the rest of the structural units of the assembly 2 can be achieved.

Figure 2:
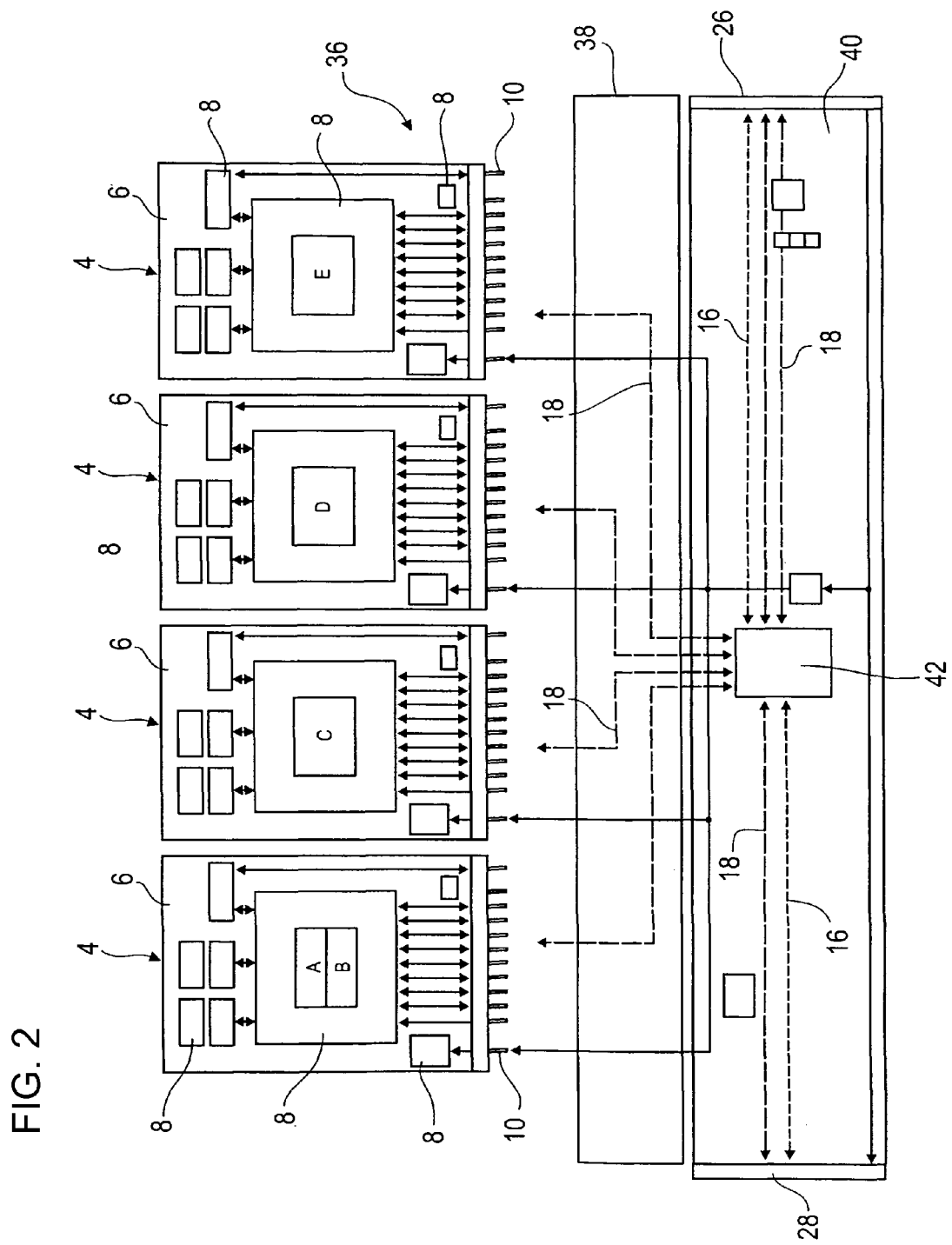
FIG. 2 is a similar diagram showing an alternative electronic assembly comprising a router on the communication unit.

A further exemplary embodiment of an electronic assembly 36 is illustrated in FIG. 2. The description below is substantially restricted to the differences with respect to the exemplary embodiment from FIG. 1, to which reference is made with regard to uniform features and functions. Substantially uniform structural parts are designated by the same reference signs, in principle, and features not mentioned are adopted in the following exemplary embodiments, without being described once again.

The electronic assembly 36 is again provided with the identical functional groups 4 and a contact board 38, which is connected to a communication unit 40. The communication unit 40 carries a router 42, which is connected to individual functional groups 4 via data lines 18 embodied as a high-speed bus. The bus connection from the router 42 to the functional groups 4 is merely indicated by the arrows of the data lines 18 that end at a further distance from the contact locations 10, and is not allocated to the contact locations 10 in concrete terms in FIG. 2. Via bus connections, the router 42 is also connected to the two interfaces 26, 28, likewise merely illustrated schematically. The entire communication between the functional groups 4 passes via the router 42, which is thereby informed about all data exchange steps of the functional groups 4 among one another and toward and from the outside.

The router 42 thus forms a communication hub of the electronic assembly 36 which is embodied in non-blocking fashion, that is to say allows, in terms of its communication data rate, all modules 8 connected to it to communicate simultaneously with the data rate allocated thereto. The router 42 is prepared for logging the entire or else only defined individual areas of the communication of the functional groups 4 among one another and, in particular, also of the functional groups 4 toward the outside. In order to enable an interrogation of communication data from outside, the router 42 is embodied with a data interface toward the outside.

In this way, data concerning communication processes of the functional groups 4 can be retrieved from outside and used for example for a functional test of the functional groups 4 or eliminating faults (debugging). It is expedient to visualize these communication data or parts thereof, that is to say to represent them e.g. graphically on a screen, such that communication faults can be found rapidly and functional faults of the functional groups 4 can be deduced therefrom. It is also possible for the router 42 already to be prepared, for example by means of corresponding programming, for comparing communication data with desired data for communication and for passing data resulting from this comparison toward the outside, thereby simplifying an evaluation from outside. In this way, a targeted checking of the functional groups 4 can already be implemented in a targeted manner during the production of the electronic assembly 36.

Figure 3:
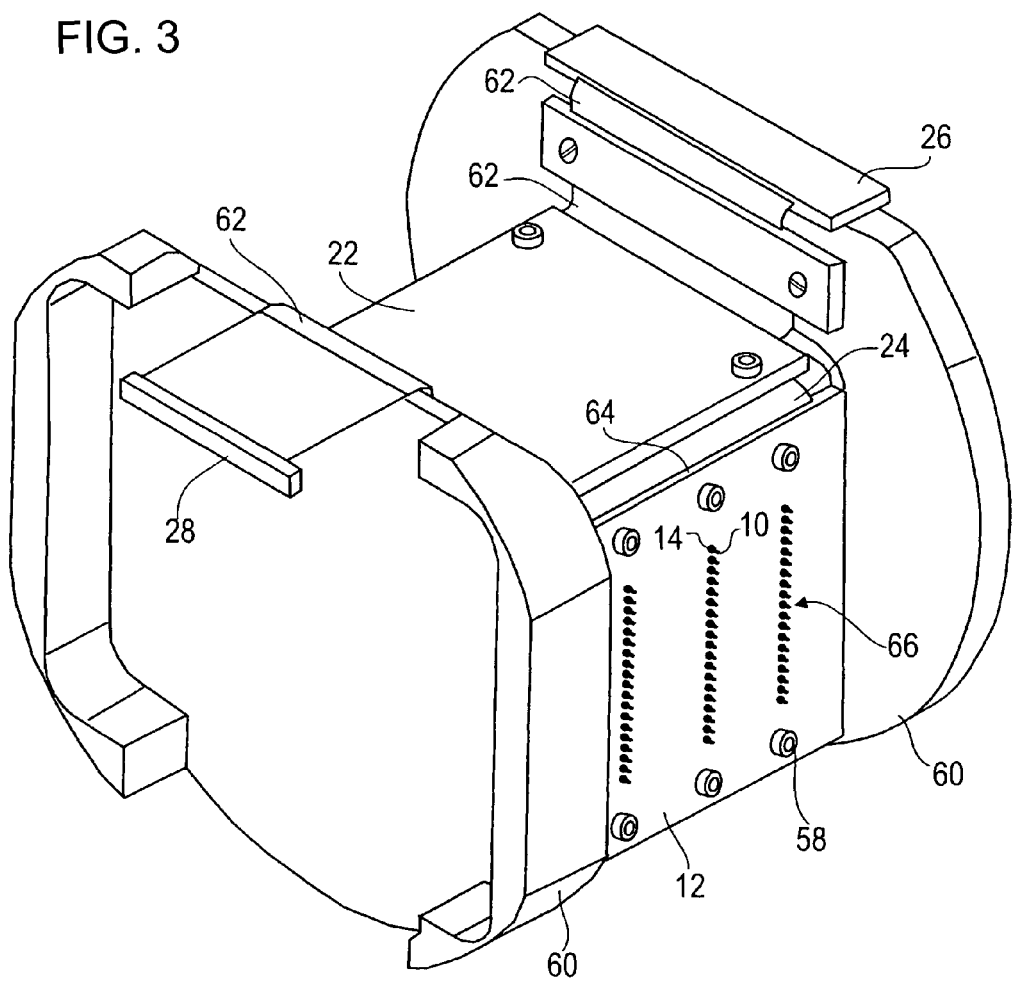
FIG. 3 shows a schematic perspective outer view of the electronic assembly.
Figure 4:
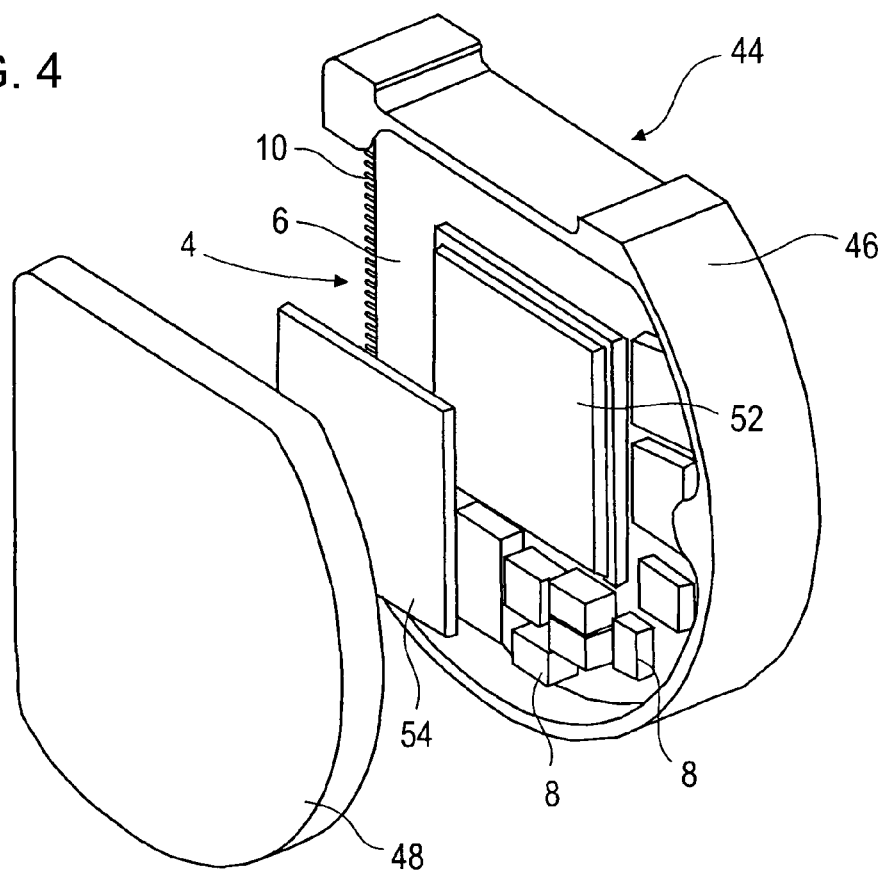
FIG. 4 shows a view of one of the functional units of the electronic assembly in a housing.
Figure 5:
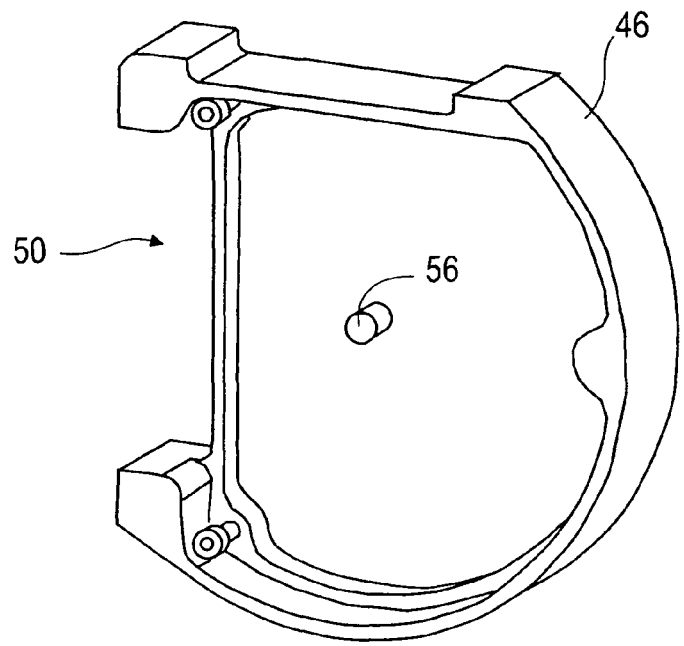
FIG. 5 is a perspective view into the housing without the structural unit.

FIGS. 3 to 5 illustrate concrete geometrical implementations of the electronic assembly 2, wherein the assembly 36 can also be embodied in a corresponding manner. As can be seen from FIG. 4, a functional group 4—and this applies to all of the functional groups 4—is mounted in a housing 44 consisting of a housing base 46 and a cover 48 to be screwed to the housing base 46. Through a lateral opening 50 (see FIG. 5), the contact locations 10 of the board element 6 project through the housing 44 toward the outside. The board element 6 is also screwed in the housing base 46.

For cooling the central processor 52, a thermal bridge 54 in the form of a gel pad is arranged between the processor and the housing cover 48. With the cover 48 closed, the gel pad 54 makes direct contact with both the processor 52 and the cover 48. On its other side, the processor 52 is likewise connected to a thermal sink, which is realized by a shaped portion 56—if appropriate likewise with an additional gel pad—which makes thermal contact with the board element 6 on its non-illustrated rear side directly or via the gel pad. Thermal contact is thereby made with the board element 6 in an inner region spaced apart from the edge region of the board element 6, such that heat emitted by the processor 52 via the shaped portion 56 is passed directly into the housing 44. Moreover, the board element 6 is held mechanically in its inner region and thereby particularly protected against strong vibrations.

The four housings 44 of the four functional groups 4 are screwed to one another in the finished state of the assembly 2 and thereby form a mechanically very stable assemblage. This assemblage is additionally screwed to the contact board 12, as is illustrated with the aid of indicated screws 58. Any other mechanical fixing by some other fixing means is also conceivable.

Placed around this fixed assembly are the contact board 12, the line-carrying film 24 and the communication unit 22, which together engage around the functional groups 4 from two sides. The assembly 2 is thereby embodied in a very compact fashion. By means of a screw joint or some other suitable fixing, the communication unit 22 is additionally connected to the functional groups 4—to the housing 44 of at least one functional group 4 in the concrete exemplary embodiment shown—, thus giving rise to a mechanically particularly stable assemblage. On the basis of an outer supporting structure 60, the assembly 2 can be incorporated mechanically stably in an environment, for example a guided missile. The signaling connection toward the outside takes place in this case via the two interfaces 26, 28, which are embodied as plugs, for example, and can be connected to a homer or a guiding part. Both interfaces 26, 28 are connected, analogously to the film 24, to the communication unit 22 via flexible connectors 62, such that signaling contact is made with the communication unit 22 on three sides (one side is not visible, but embodied in the same way) in the design fixed-flexible-fixed.

In order to achieve a particularly compact and resource-saving geometry of the assembly 2, the communication unit 22 is arranged in a specific geometry with respect to the contact board 12. In the case of this geometry, the board elements 6 conceived of in lengthened fashion intersect the communication unit 22. In the case of a smaller communication unit 22 it is sufficient if at least one of the board elements 6 in a conceptually lengthened form intersects the communication unit 22. In general terms, the communication unit 22 is connected to the contact board 12 via a plurality of data lines 16, 18, wherein the data lines 16, 18 are connected to the contact board 12 on that side 64 thereof toward which the rows 66 of the contact locations 10 of the board elements 6 face, as is illustrated in FIG. 3.

In the case of the exemplary embodiment shown, contact board 12 and communication unit 22 form a right angle with one another, other angles likewise being conceivable. A parallelism of board elements 6 and of the communication unit 22 is not provided, in particular. By virtue of this geometry, the data lines 16, 18 can be led from the functional groups 4 to the communication unit 22, without having to cross an imaginary line respectively formed by the rows 66. An imaginary line in a lengthening of the rows 66, which are in each case parallel to the board element 6 assigned thereto, therefore points directly toward the side 64 and toward the communication unit 22 or a corresponding contact-connection of a data line 16, 18 from the contact board 12 to the communication unit 22.

The following is a list of reference numerals and the corresponding element described in the above specification:

2 Assembly
4 Functional group
6 Board element
8 Module
10 Contact location
12 Contact board
14 Contact receptacle
16 Data line
18 Data line
20 Power supply line
22 Communication unit
24 Film
26 Interface
28 Interface
30 Power supply unit
32 Component
34 Component
36 Assembly
38 Contact board
40 Communication unit
42 Router
44 Housing
46 Housing base
48 Cover
50 Opening
52 Processor
54 Bridge
56 Shaped portion
58 Screw
60 Supporting structure
62 Connector
64 Side
66 Row

The invention claimed is:

1. An electronic assembly, comprising:
a plurality of individual functional units each including a circuit board populated with electronic modules;
a modular backplane, including:
a contact board connecting said circuit boards of said plurality of individual functional units to one another in terms of signaling;
an active communication unit directly connected to said contact board by data lines and mounted mechanically separately from said contact board in the electronic assembly, said communication unit being populated with electronic components configuring said communication unit to serve as a communication interface for said electronic modules of said circuit boards, said communication unit additionally including an interface in communication with an external unit including at least one of an actuator and an external sensor.

2. The electronic assembly according to claim 1, wherein said contact board is passive, carrying no active or passive electronic components.

3. The electronic assembly according to claim 1, wherein said functional units are all embodied identically in terms of hardware and are equipped with an identical processor, said processor being configured to process different tasks by executing mutually different data processing programs.

4. The electronic assembly according to claim 1, wherein said contact board is configured with a task-specific line routing that is adapted to individual tasks of the functional units and that is embodied differently from one to a second functional unit than from a second to a third functional unit.

5. The electronic assembly according to claim 1, wherein one of said electronic components is a router configured for logging communication between said electronic modules of said board elements.

6. The electronic assembly according to claim 1, wherein said communication unit includes a power supply for said functional units, said power supply producing an intermediate voltage lying between a voltage fed in externally and a voltage required by said modules of said functional units.

7. The electronic assembly according to claim 1, wherein said communication unit is configured for controlling a switch-on sequencing of the individual said functional units.

8. The electronic assembly according to claim 1, wherein said communication unit includes a test interface for functionally testing the individual said functional units.

9. An electronic system, comprising:
at least a first electronic assembly and a second electronic assembly, each electronic assembly according to claim 1, wherein said functional units of said first electronic assembly are identical in hardware terms and, in terms of software-driven tasks, are at least partly different than said functional units of said second electronic assembly, wherein said functional units of said first and second electronic assemblies are wired differently by means of said two contact boards, and said two communication units are different in hardware terms and are respectively adapted to a corresponding task of the respective said electronic assembly thereof.

10. A method of operating the electronic assembly according to claim 1, wherein one of the electronic components is a router, the method which comprises logging with the router a communication of at least one functional unit, and comparing communication data with desired data for communication and visualizing communication data for displaying communication processes.

11. An electronic assembly, comprising:
a plurality of functional units each including a board element populated with electronic modules, at least individual functional units communicating with systems outside the electronic assembly in order to bring about control or to receive sensor or control signals;
a modular backplane, including:
a contact board connecting said board elements of said plurality of functional units to one another in terms of signaling;
an active communication unit directly connected to said contact board by data lines and mounted mechanically separately from said contact board in the electronic assembly, said communication unit being populated with electronic components configuring said communication unit to serve as a communication interface for said electronic modules of said board elements, said communication unit additionally including an interface in communication with an external unit including an actuator for actuating mechanical objects.

12. The electronic assembly of claim 11, further including an outer supporting structure mechanically stably housing the electronic assembly inside a missile.

* * * * *